United States Patent
Wang et al.

(10) Patent No.: US 10,211,107 B1
(45) Date of Patent: Feb. 19, 2019

(54) METHOD OF FABRICATING FINS INCLUDING REMOVING DUMMY FINS AFTER FLUOROCARBON FLUSH STEP AND OXYGEN CLEAN STEP

(71) Applicant: UNITED MICROELECTRONICS CORP., Hsin-Chu (TW)

(72) Inventors: Chih-Yi Wang, Tainan (TW); Tien-Shan Hsu, Tainan (TW); Yu-Chih Su, Tainan (TW); Chi-Hsuan Cheng, Kaohsiung (TW); Cheng-Pu Chiu, New Taipei (TW); Te-Chang Hsu, Tainan (TW); Chin-Yang Hsieh, Tainan (TW); An-Chi Liu, Tainan (TW); Kuan-Lin Chen, Changhua County (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/700,175

(22) Filed: Sep. 10, 2017

(51) Int. Cl.
*H01L 21/8234* (2006.01)
*H01L 21/3065* (2006.01)
*H01L 21/02* (2006.01)
*H01L 21/762* (2006.01)

(52) U.S. Cl.
CPC ........... *H01L 21/823431* (2013.01); *H01L 21/02057* (2013.01); *H01L 21/02164* (2013.01); *H01L 21/02271* (2013.01); *H01L 21/3065* (2013.01); *H01L 21/76224* (2013.01); *H01L 21/823481* (2013.01)

(58) Field of Classification Search
CPC .................................................. H01L 29/7851
See application file for complete search history.

(56) References Cited

U.S. PATENT DOCUMENTS

| | | | |
|---|---|---|---|
| 8,455,325 B2 | 6/2013 | Fukuda | |
| 8,470,714 B1 | 6/2013 | Tsai | |
| 8,674,413 B1 | 3/2014 | Chi | |
| 2011/0097889 A1 | 4/2011 | Yuan | |
| 2014/0264725 A1* | 9/2014 | Chuang | H01L 29/0649 257/510 |
| 2016/0056045 A1* | 2/2016 | Huang | H01L 21/3065 257/623 |
| 2017/0170174 A1* | 6/2017 | Chang | H01L 27/0886 |
| 2018/0040713 A1* | 2/2018 | Chang | H01L 21/82343 |
| 2018/0082903 A1* | 3/2018 | Voronin | H01L 21/82343 |

OTHER PUBLICATIONS

Po Cheng Huang et al., "Extra treatment to solve Fin damage issue", Invention Disclosure, Dec. 10, 2014, p. 1-22.
Tseng, Title of Invention: Semiconductor Device and Method for Fabricating the Same, U.S. Appl. No. 14/981,929, filed Dec. 29, 2015.

* cited by examiner

*Primary Examiner* — John P. Dulka
(74) *Attorney, Agent, or Firm* — Winston Hsu

(57) ABSTRACT

A method of fabricating fins includes providing a silicon substrate. The silicon substrate is etched to form numerous fin elements. A surface of each of the fin elements is silicon. Etch residues are formed on the fin elements after the silicon substrate is etched. After that, a flush step is performed on the fin elements by flushing the surface of each of the fin elements with fluorocarbons. The etch residues on the fin elements are removed by the flush step. After the flush step, a strip step is performed on the fin elements by treating the surface of each of the fin elements with oxygen plasma.

6 Claims, 5 Drawing Sheets

METHOD OF FABRICATING FINS INCLUDING REMOVING DUMMY FINS AFTER FLUOROCARBON FLUSH STEP AND OXYGEN CLEAN STEP

BACKGROUND OF THE INVENTION

1. Field of the Invention

The present invention relates to a method of fabricating fins, and particularly to a method of fabricating fins including a flush step.

2. Description of the Prior Art

A fin-type field effect transistor (FinFET) is a type of transistor that has a fin containing a channel region and source and drain regions. A simple FinFET is formed by the intersection of a fin and a gate structure. The gate structure covers the channel region of the fin, whereas the source and drain regions of the fin extend beyond the coverage of the gate structure. FinFET processing is often accomplished using an etching process such as a dry etching process to form fins.

Dry etch processes are desirable for selectively removing material from semiconductor substrates. This desirability stems from the ability to gently remove material from miniature structures with minimal physical disturbance. Dry etching processes involve the exposure of a substrate to remote plasma by-products formed from one or more precursors. Therefore, after fins are formed by the dry etching process, some etch residues will be attached to the surface of the fins.

These etch residues will cause cracking of the fins after a gate structure is stacked on the fins.

SUMMARY OF THE INVENTION

In light of the above, the present invention provides a fabricating method to remove etch residues on fins.

According to a preferred embodiment of the present invention, a method of fabricating fins includes providing a silicon substrate divided into a first region and a second region. Then, the silicon substrate is etched to form numerous fin elements within the first region and the second region. A surface of each of the fin elements is silicon. A flush step is performed on the fin elements by flushing the surface of each of the fin elements with fluorocarbons. After the flush step, a strip step is performed on the fin elements by treating the surface of each of the fin elements with oxygen plasma. After the strip step, the fin elements within the second region are entirely removed and the fin elements within the first region are remained. Finally, each of the fin elements within the first region is divided into numerous fins.

These and other objectives of the present invention will become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a method of fabricating fins according to a preferred embodiment of the present invention, wherein:

FIG. 1 shows a top view of fin elements;
FIG. 2 is a sectional view taken along line AA' in FIG. 1;
FIG. 3 continues from FIG. 2;
FIG. 4 continues from FIG. 3;
FIG. 5 shows a top view of fin elements covered by a silicon oxide layer;
FIG. 6 is a sectional view taken along line BB' in FIG. 5;
FIG. 7 is a top view continuing from FIG. 5;
FIG. 8 is a top view continuing from FIG. 7;
and
FIG. 9 is a sectional view taken along line CC' in FIG. 8.

DETAILED DESCRIPTION

Figure 1:
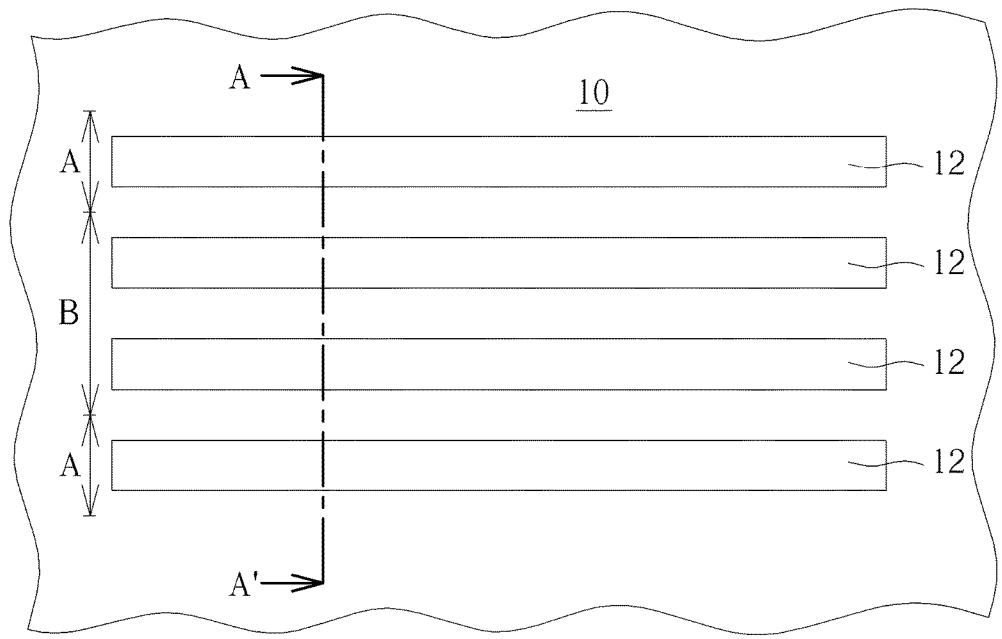
Figure 2:
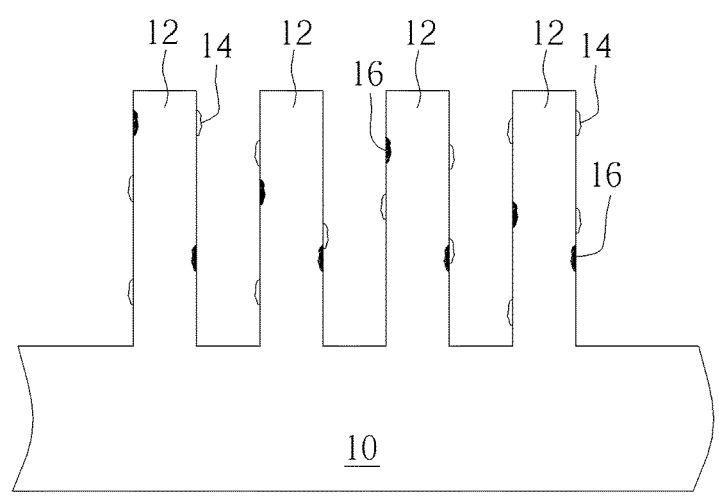
Figure 5:
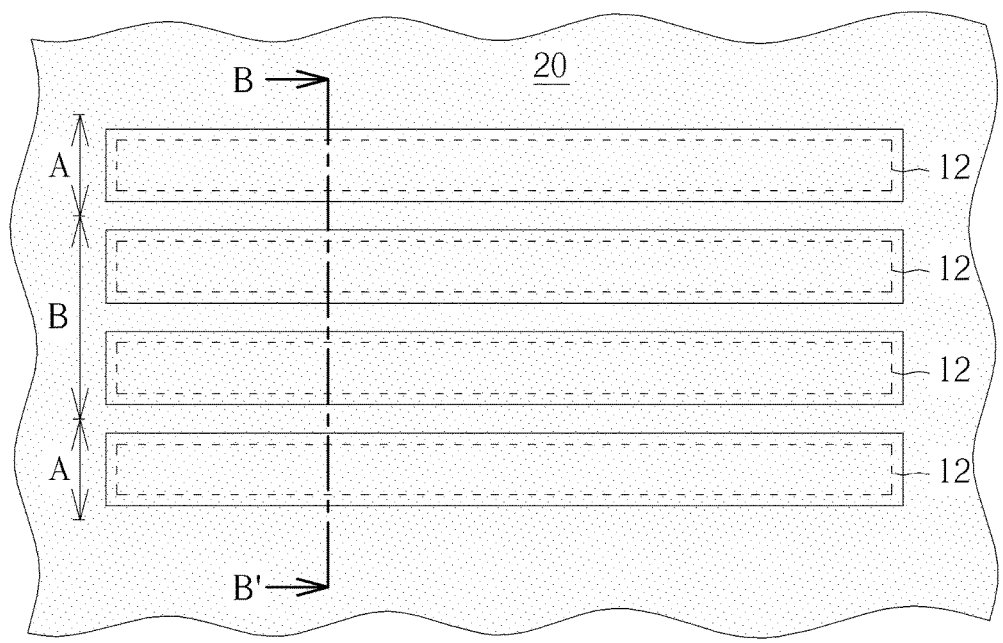
Figure 6:
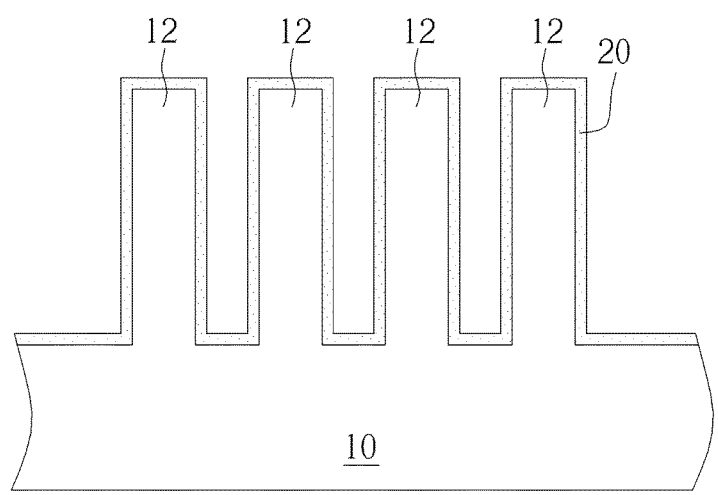
Figure 7:
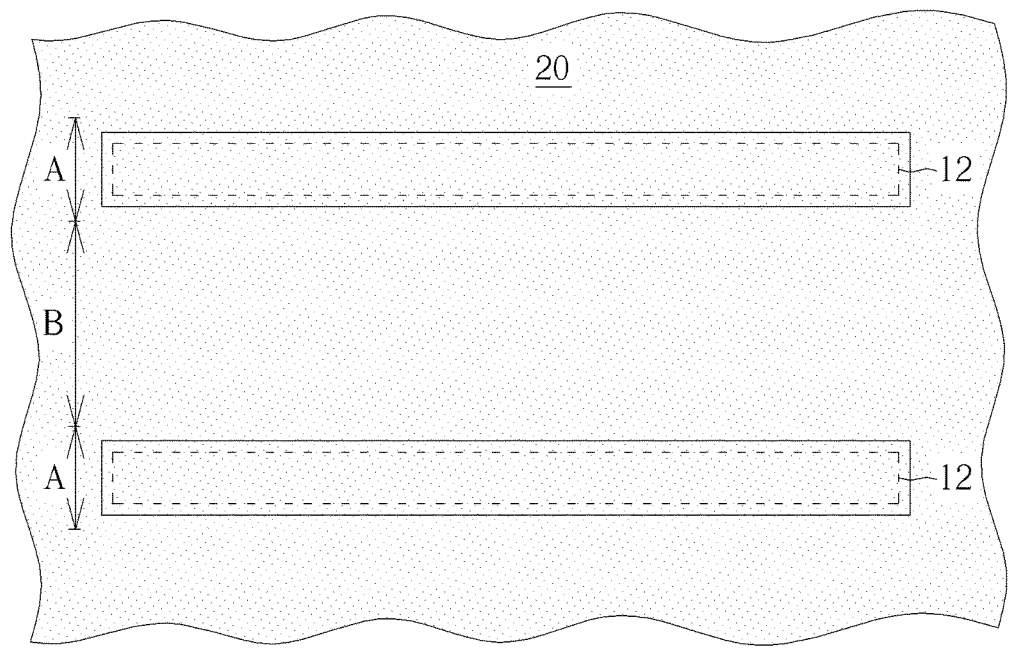
Figure 8:
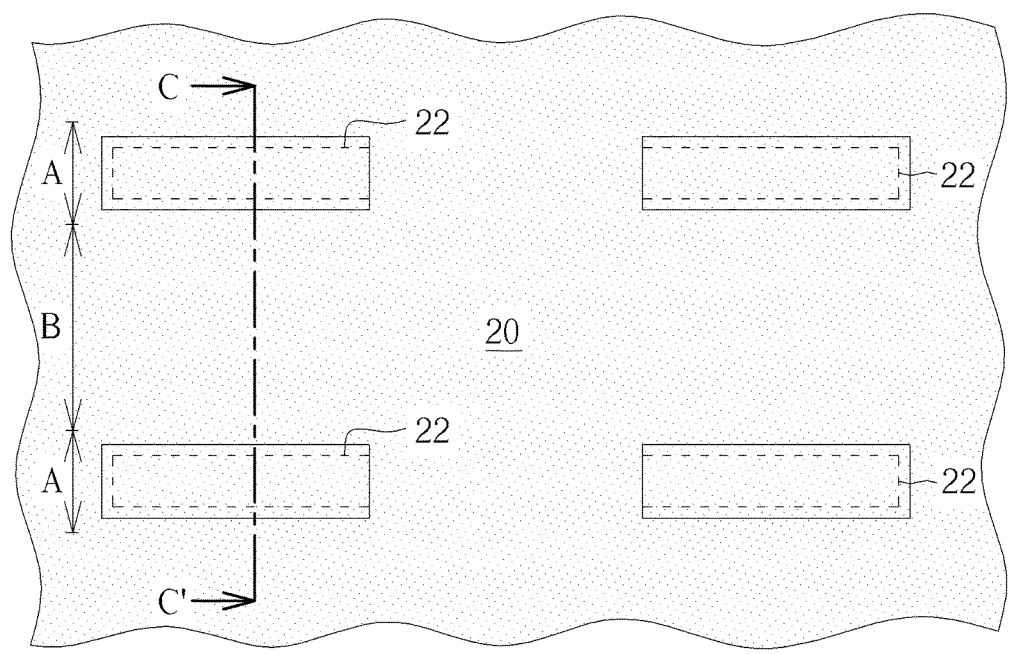
Figure 9:
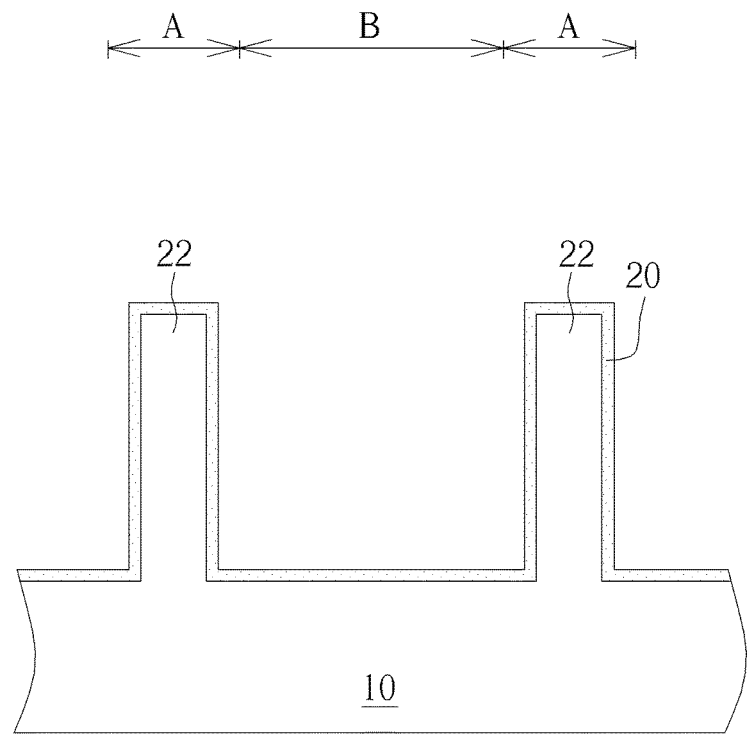

FIG. 1 to FIG. 9 depict a method of fabricating fins according to a preferred embodiment of the present invention, wherein FIG. 2 is a sectional view taken along line AA' in FIG. 1, FIG. 6 is a sectional view taken along line BB' in FIG. 5 and FIG. 9 is a sectional view taken along line CC' in FIG. 8. Furthermore, FIG. 3 continues from FIG. 2, FIG. 4 continues from FIG. 3, FIG. 6 continues from FIG. 4, FIG. 7 continues from FIG. 5, and FIG. 8 continues from FIG. 7.

Please refer to FIG. 1 and FIG. 2. A silicon substrate 10 is provided. The silicon substrate 10 is divided into a first region A and a second region B. Then, an etching process is performed to etch the silicon substrate 10 to form numerous fin elements 12 within the first region A and the second region B. The number of the fin elements can be adjusted based on different requirements. A surface of each of the fin elements 12 is made of silicon. It is noteworthy that etching residues 14, possibly including organic polymers, remain on the surfaces of the fin elements 12 after the etching process is completed. Besides the etch residues 14, there is some surface damage 16 on the surfaces of the fin elements 12.

Figure 3:
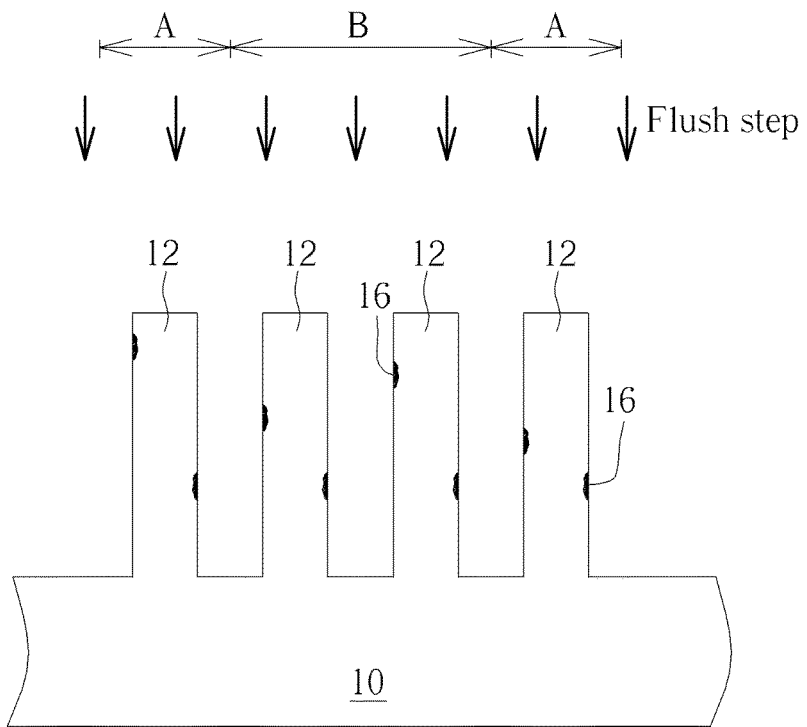
Figure 4:
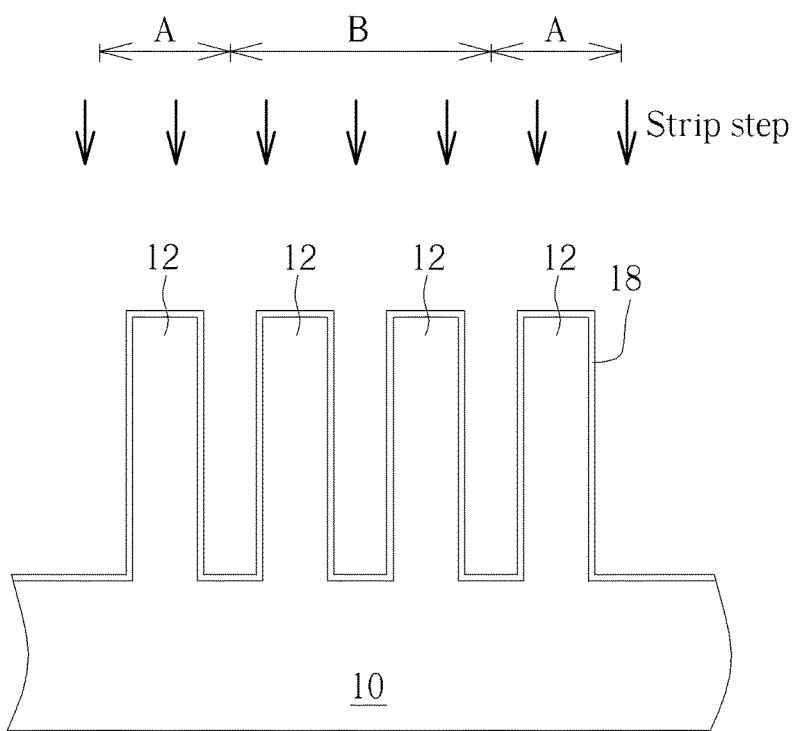

As shown in FIG. 3, a cleaning step is performed on the fin elements 12. The cleaning step includes performing a flush step followed by a strip step. In detail, the flush step is performed by flushing the surface of each of the fin elements 12 with fluorocarbons. The fluorocarbons include $CF_4$, $C_2F_6$ or $C_3F_8$. The etch residues 14 on the fin elements 12 can be removed by the flush step. According to a preferred embodiment of the present invention, the fluorocarbon used in the flush step is $CF_4$. The flow rate of the fluorocarbons is preferably between 9 and 11 sccm (standard cubic centimeters per minute). The operating time of the flush step is preferably between 1 and 10 seconds.

The strip step is performed by treating the surface of each of the fin elements 12 with oxygen plasma. The surface damage 16 of the fin elements 12 can be fixed by the strip step. The flow rate of the oxygen is preferably between 180 and 220 sccm. The operating time of the strip step is preferably between 27 and 33 seconds. Moreover, a silicon oxide layer 18 is formed on the surfaces of the fin elements 12 as by-products during the strip step. The silicon oxide layer 18 may be native oxide.

The cleaning step can be performed repeatedly until the etch residues 14 and the surface damage 16 on the fin elements 12 are totally removed or fixed. Furthermore, if the cleaning step is only performed once, during the flush step and before the flush step, the surface of each of the fin elements 12 will not be covered by silicon oxide. If the cleaning step is performed repeatedly, the surface of each of the fin elements 12 will not be covered by silicon oxide during the flush step and before the flush step of the first time of the cleaning process is performed.

As shown in FIG. 5 and FIG. 6, the silicon oxide layer 18 is removed. Later, an oxidation process such as in-situ steam generation is performed to generate a silicon oxide layer 20 on the fin elements 12 and the silicon substrate 10. The silicon oxide layer 20 can smooth the surface of each of the fin elements 12.

As shown in FIG. 7, the fin elements 12 within the second region B are entirely removed, and the fin elements 12 within the first region B remain. The fin elements 12 within the second region B usually serve as dummy fins, while the fin elements 12 within the first region A serve as active fins. Dummy fins can prevent the active fins from being seriously affected by the loading effect during the etching process shown in FIG. 1.

As shown in FIG. 8 and FIG. 9, each of the remaining fin elements 12 within the first region A is divided into numerous fins 22. In detail, part of each of the fin elements 12 within the first region A is removed; therefore, the fin elements 12 within the first region A are segmented. At this point, fins 22 of the present invention are completed.

According to another embodiment, the formation of the silicon oxide layer 20 can be performed after the fins 22 are formed, i.e. the silicon oxide layer 20 is not formed during the step shown in FIG. 6. In detail, the cleaning step is followed directly by removing the fin elements 12 within the second region B. Then, the fin elements 12 within the first region A are divided. After that, the silicon oxide layer 20 can be formed.

Figure 10:
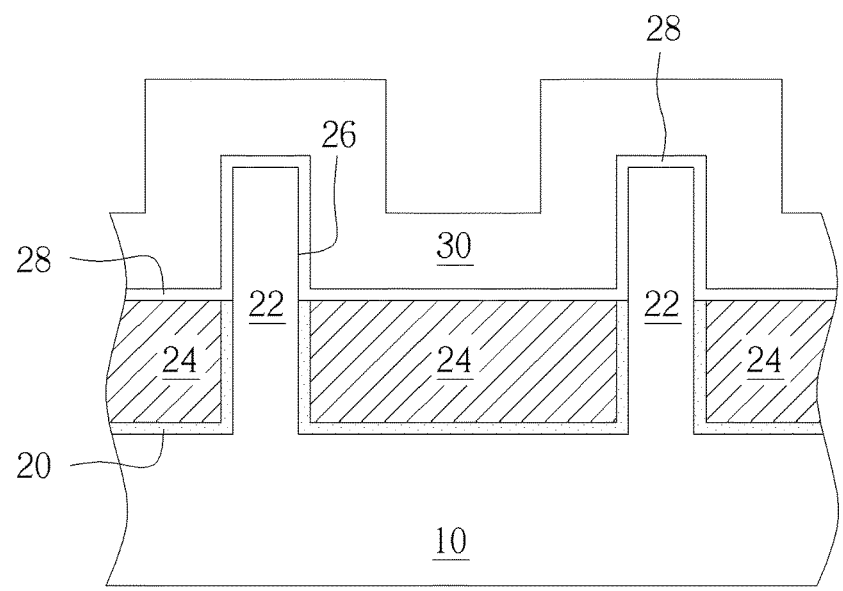
FIG. 10 depicts FinFETs fabricated by fins of the present invention.

FIG. 10 depicts FinFETs fabricated by fins of the present invention, wherein FIG. 10 continues from FIG. 9, and wherein like reference numerals are used to refer to like elements throughout. As shown in FIG. 10, a flowable chemical vapor deposition (FCVD) process is performed to form a silicon oxide layer 24 filling a trench 26 between the fins 22 and covering the fins 22. Next, a planarizing process, such as a chemical mechanical polishing (CMP) process is conducted to remove part of the silicon oxide layer 24 and part of the silicon oxide layer 20 to make part of the fins 22 protrude from the remaining silicon oxide layer 24. The remaining silicon oxide layer 24 in the trench 16 serves as an STI (shallow trench isolation). After that, a gate oxide layer 28 and a gate 30 are formed and cross the fins 22. Later, source/drain doped regions (not shown) can be formed in the fins 22 at two side of the gate 30.

Conventionally, the etch residues 14 on the fin elements 12 become weak points of the fins 22. After the gate oxide layer 28 and the gate 30 are stacked on the fins 22, as long as the etch residues 14 remain on the fins 22, the fins 22 will easily be cracked from the weak points. In the present invention, the etch residues 14 on the fin elements 12 are removed by using the flush step. Therefore, the surface of the fins 22 becomes smooth, and the roughness of the surface of the fins 22 is decreased due to the flush step. In this way, the probability of cracking can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating fins, comprising providing a silicon substrate divided into a first region and a second region;

etching the silicon substrate to form a plurality of fin elements within the first region and the second region, wherein a surface of each of the plurality of fin elements is silicon;

performing a flush step on the plurality of fin elements by flushing the surface of each of the plurality of fin elements with fluorocarbons;

after the flush step, performing a strip step on the plurality of fin elements by treating the surface of each of the plurality of fin elements with oxygen plasma;

after the strip step, entirely removing the plurality of fin elements within the second region, wherein the plurality of fin elements within the first region stay after entirely removing the plurality of fin elements within the second region; and dividing each of the plurality of fin elements within the first region into a plurality of fins.

2. The method of fabricating fins of claim 1, wherein the fluorocarbons comprises $CF_4$, $C_2F_6$ or $C_3F_8$.

3. The method of fabricating fins of claim 1, wherein the flush step and the strip step comprise a cleaning step, and the cleaning step is performed repeatedly.

4. The method of fabricating fins of claim 1, wherein residues are formed on the surface of each of the plurality of fin elements after the etching of the silicon substrate.

5. The method of fabricating fins of claim 4, wherein the residues on the surface of each of the plurality of fin elements are removed in the flush step.

6. The method of fabricating fins of claim 1, further comprising:

after the strip step and before removing the plurality of fin elements within the second region, forming a silicon oxide layer on the plurality of fin elements.

* * * * *